United States Patent
Lee et al.

(10) Patent No.: US 11,011,303 B2
(45) Date of Patent: May 18, 2021

(54) DUMMY FILL WITH EDDY CURRENT SELF-CANCELING ELEMENT FOR INDUCTOR COMPONENT

(71) Applicant: GLOBALFOUNDRIES U.S. Inc., Santa Clara, CA (US)

(72) Inventors: Tung-Hsing Lee, Waterford, NY (US); Roderick A Augur, Saratoga Springs, NY (US); Siva R K Dangeti, Rexford, NY (US); Alexander L. Martin, Greenfield Center, NY (US); Anvitha Shampur, Ballston Spa, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 246 days.

(21) Appl. No.: 16/106,162

(22) Filed: Aug. 21, 2018

(65) Prior Publication Data
US 2020/0066438 A1    Feb. 27, 2020

(51) Int. Cl.
| | | |
|---|---|---|
| H01F 5/00 | (2006.01) | |
| H01F 27/34 | (2006.01) | |
| H01L 49/02 | (2006.01) | |
| H01F 27/28 | (2006.01) | |
| H01F 41/04 | (2006.01) | |
| H01F 41/12 | (2006.01) | |
| H01F 27/32 | (2006.01) | |

(52) U.S. Cl.
CPC .............. *H01F 27/34* (2013.01); *H01F 5/00* (2013.01); *H01F 5/003* (2013.01); *H01F 27/2804* (2013.01); *H01F 27/327* (2013.01); *H01F 41/041* (2013.01); *H01F 41/127* (2013.01); *H01L 28/10* (2013.01); *H01F 2027/2809* (2013.01); *H01F 2027/348* (2013.01)

(58) Field of Classification Search
CPC . H01F 27/34; H01F 5/003; H01F 5/00; H01F 27/2804; H01F 41/041; H01F 41/127; H01F 27/327; H01F 2027/348; H01F 2027/2809; H01F 2017/0053; H01F 17/0013; H01F 17/0006; H01F 2017/0073; H01L 28/10
See application file for complete search history.

(56) References Cited

U.S. PATENT DOCUMENTS

| | | |
|---|---|---|
| 5,763,955 A | 6/1998 | Findley et al. |
| 5,854,125 A | 12/1998 | Harvey |

(Continued)

*Primary Examiner* — Tuyen T Nguyen
(74) *Attorney, Agent, or Firm* — Hoffman Warnick LLC

(57) ABSTRACT

A dummy fill element for positioning inside an active inductor component of an integrated circuit (IC), the inductor component, the IC and a related method, are disclosed. The active inductor component is configured to convert electrical energy into magnetic energy to reduce parasitic capacitance in an IC. The dummy fill element includes: a first conductive incomplete loop having a first end and a second end, and a second conductive incomplete loop having a first end and a second end. First ends of the first and second conductive incomplete loops are electrically connected, and the second ends of the first and second conductive incomplete loops are electrically connected. In this manner, eddy currents created in each conductive incomplete loop by the magnetic energy cancel at least a portion of each other, allowing for a desired metal fill density and maintaining the inductor's Q-factor.

19 Claims, 5 Drawing Sheets

(56) References Cited

U.S. PATENT DOCUMENTS

| | | |
|---|---|---|
| 7,235,424 B2 | 6/2007 | Chen et al. |
| 7,393,755 B2 | 7/2008 | Smith et al. |
| 2005/0007116 A1* | 1/2005 | Davis .................. G01R 33/365 324/318 |
| 2011/0133308 A1 | 6/2011 | Chan et al. |

* cited by examiner

DUMMY FILL WITH EDDY CURRENT SELF-CANCELING ELEMENT FOR INDUCTOR COMPONENT

BACKGROUND

The present disclosure relates to integrated circuits, and more specifically, to a dummy fill element including an eddy current self-canceling element for an inductor component.

The use of multiple interconnected devices over a wide area, colloquially known as "internet of things" or "IOT," is a rapidly growing area of electronics engineering. Each interconnected device in an IOT arrangement can include one or more radio frequency (RF) components to provide signal transmission and reception with respect to other devices in the same network. The sheer number of interconnected devices in such arrangements has accompanied significant increases in the signal processing burden on electronic systems. The ever-increasing density of features in a device may impose additional technical constraints, e.g., parasitic capacitance. Parasitic capacitance refers to a technical phenomenon in which two conductive devices in close proximity to each other exhibit electrical capacitance despite being electrically separate.

A circuit designer may introduce additional components to reduce or eliminate adverse effects of parasitic capacitance, and other parasitic effects. One such component is an inductor. An inductor, also called a coil, reactor or choke, is a passive two-terminal electrical structure that typically includes a number of metal turns that store energy in a magnetic field when an electric current flows through them. An inductor opposes transient buildup of electric current between nodes, and thus may counteract the expected behavior of parasitic electrical elements. A quality factor (Q-factor) of an inductor is a ratio of inductive reactance to resistance at a given frequency, and indicates an inductor's efficiency. An inductor typically includes a relatively large open surface area in a center of its metal turns. The open center of the metal turns can present challenges during planarization of metal layers of an integrated circuit (IC) that include a layer of the inductor, i.e., in back-end-of-line processing.

Planarization refers to various processes that make a surface more planar (that is, more flat and/or smooth). Chemical mechanical polishing (CMP) is one conventional planarization process which planarizes surfaces with a combination of chemical reactions and mechanical forces. Typically, the CMP process requires controlled, uniform metal pattern density to prevent damage such as gouging and dishing to a dielectric or metal in a metal layer. To accommodate a uniform metal pattern density, dummy fill elements may be positioned in a metal layer. The dummy fill elements are not part of the active electrical elements of the IC, but provide additional metal in a metal layer to prevent CMP damage, e.g., gouging, dishing, etc., that would occur if they were not present. Dummy fill elements typically have very simple cross-sectional shapes, e.g., squares, Ls, Ts, crosses, etc. Unfortunately, as shown in FIG. 1, conventional dummy fill elements 10 inside a metal turn 12 of an inductor 14 allow eddy currents 16 to flow in the dummy fill shapes during operation of the IC, which impacts the Q-factor of the inductor at high frequencies. Eddy currents are circular or looping electrical currents induced within conductors by a changing magnetic field in the conductor based on Faraday's law of induction. Eddy currents flow in planes perpendicular to the magnetic field in closed circular paths within the conductors of the dummy fill elements and below the inductor. The eddy currents can impact the Q-factor of the inductor and, hence, the performance of the IC.

SUMMARY

An aspect of the disclosure is directed to a dummy fill element, comprising: a first conductive incomplete loop having a first end and a second end, and a second conductive incomplete loop having a first end and a second end, wherein the first end of the first conductive incomplete loop and the first end of the second conductive incomplete loop are electrically connected, and the second end of the first conductive incomplete loop and the second end of the second conductive incomplete loop are electrically connected.

Another aspect of the disclosure includes an inductor component for an integrated circuit (IC), the inductor component comprising: an active inductor element having a plurality of metal turns and an open center; and a dummy fill element positioned within the open center of the inductor component, the dummy fill element including: a first conductive incomplete loop having a first end and a second end, and a second conductive incomplete loop having a first end and a second end, wherein the first end of the first conductive incomplete loop and the first end of the second conductive incomplete loop are electrically connected, and the second end of the first conductive incomplete loop and the second end of the second conductive incomplete loop are electrically connected.

An aspect of the disclosure related to an integrated circuit (IC), comprising: an active inductor component having a plurality of metal turns and an open center; and a first dummy fill element positioned within the open center of the inductor component, the first dummy fill element including a first eddy current canceling element including: a first conductive incomplete loop having a first end and a second end, and a second conductive incomplete loop having a first end and a second end, wherein the first ends of the first conductive incomplete loop and the second conductive incomplete loop are electrically connected, and the second ends of the first conductive incomplete loop and the second conductive incomplete loop are electrically connected.

Another aspect of the disclosure is directed to a method, comprising: forming a metal turn of an inductor component in a first dielectric layer; and forming at least one dummy fill element laterally inside the metal turn in at least one dielectric layer, each dummy fill element including: a first conductive incomplete loop having a first end and a second end, and a second conductive incomplete loop having a first end and a second end, wherein the first end of the first conductive incomplete loop and the first end of the second conductive incomplete loop are electrically connected, and the second end of the first conductive incomplete loop and the second end of the second conductive incomplete loop are electrically connected.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
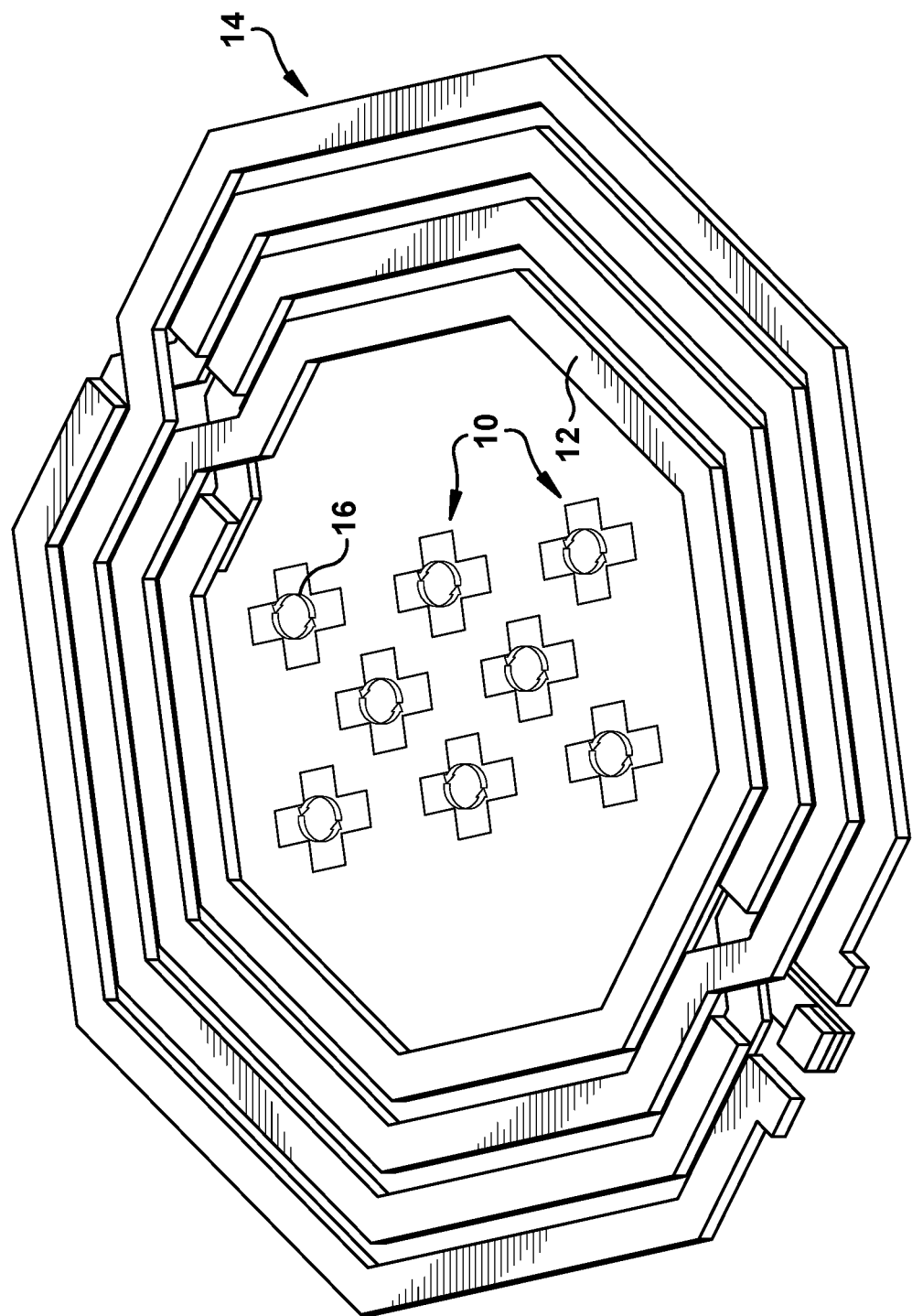
FIG. 1 shows a perspective view of a conventional inductor component and dummy fill element.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a dummy fill element for positioning inside an active inductor component of an integrated circuit (IC). An inductor component, IC and related method are also disclosed. As noted, the active inductor component may be configured to convert electrical energy into magnetic energy to reduce parasitic capacitance in an IC. The dummy fill element includes: a first conductive incomplete loop having a first end and a second end, and a second conductive incomplete loop having a first end and a second end. First ends of the first and second conductive incomplete loops are electrically connected, and the second ends of the first and second conductive incomplete loops are electrically connected. Eddy currents created in each conductive incomplete loop by the magnetic energy cancel at least a portion of each other out, i.e., they self-cancel, in the dummy fill element. The dummy fill element thus allows for a desired metal fill density and maintaining the inductor's Q-factor.

Figure 2:
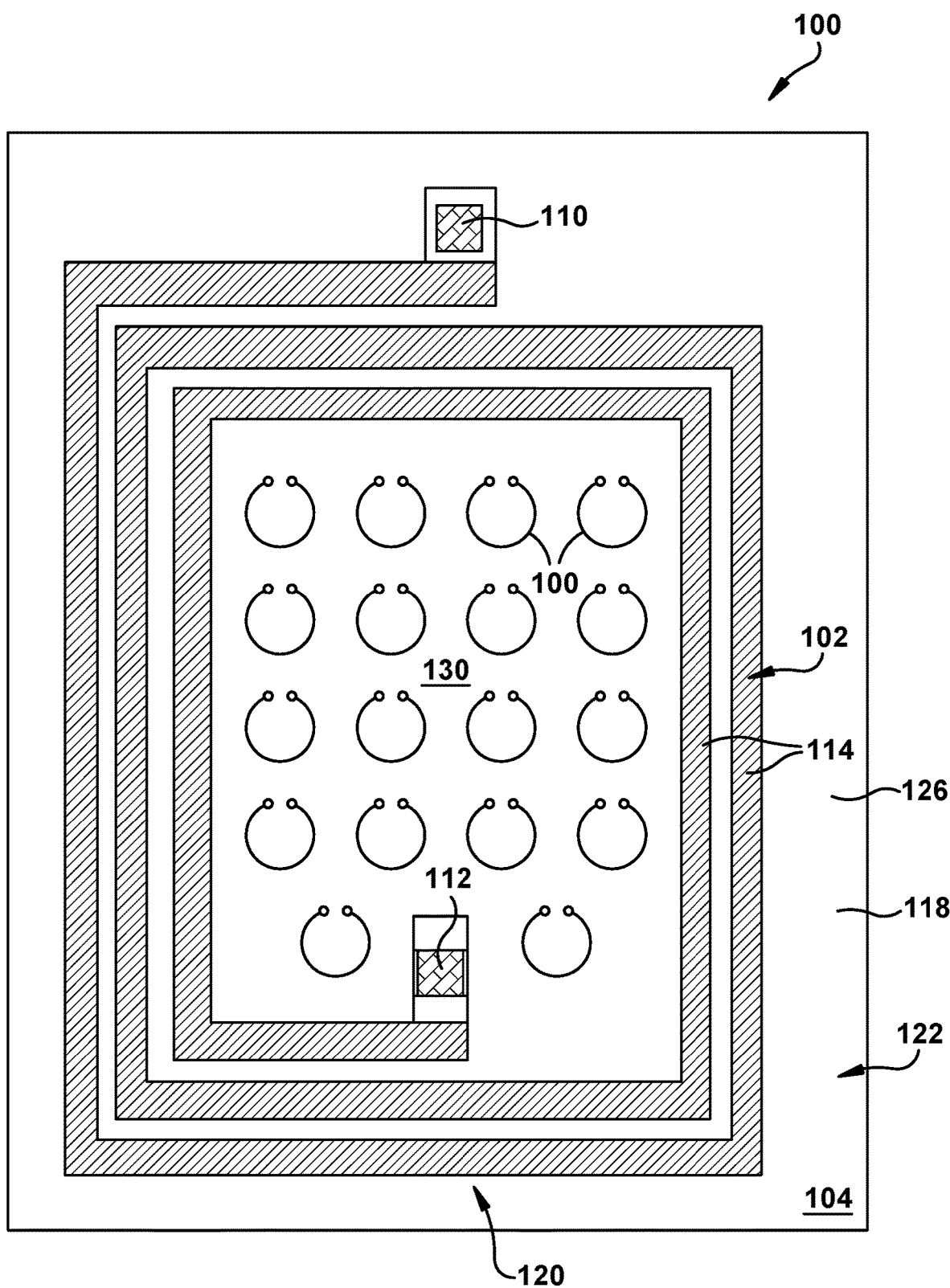
FIG. 2 shows a plan view of an inductor component for an IC with a dummy fill element, according to embodiments of the disclosure.
Figure 3:
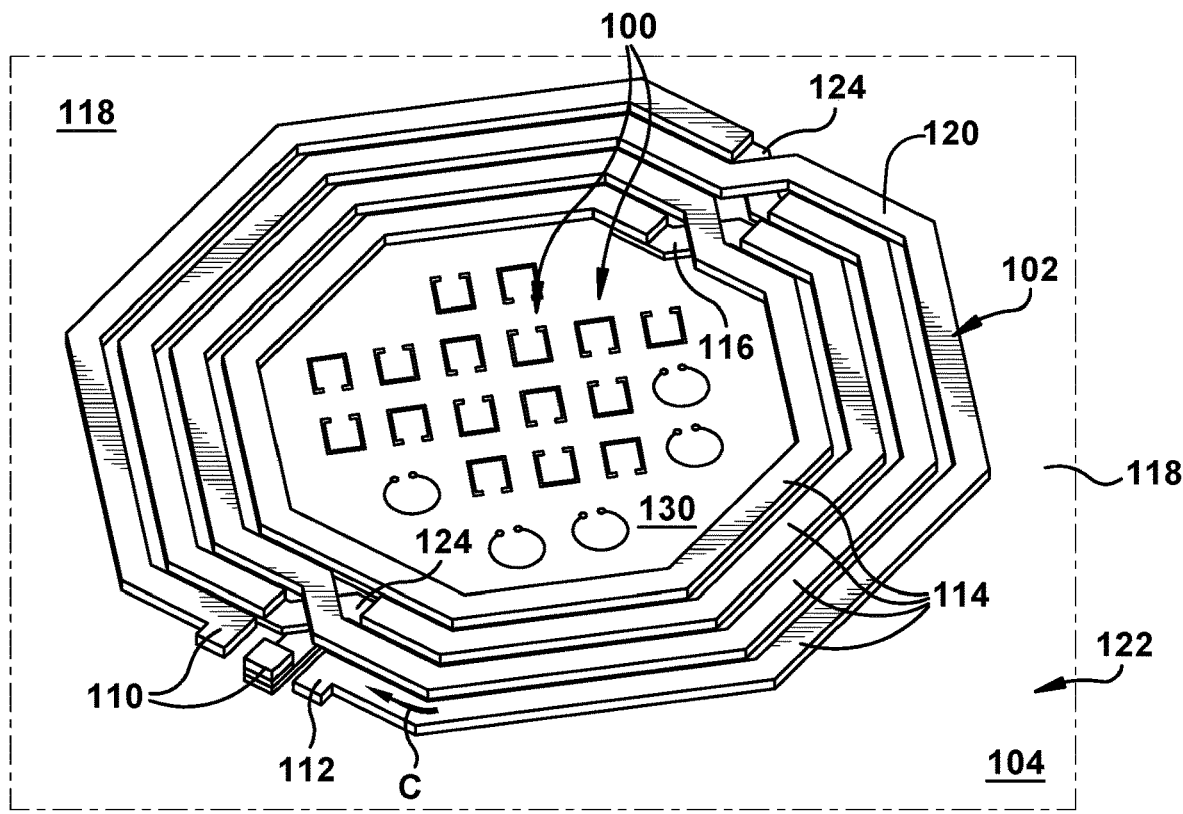
FIG. 3 shows a perspective view of an inductor component for an IC with a dummy fill element, according to embodiments of the disclosure.
Figure 4:
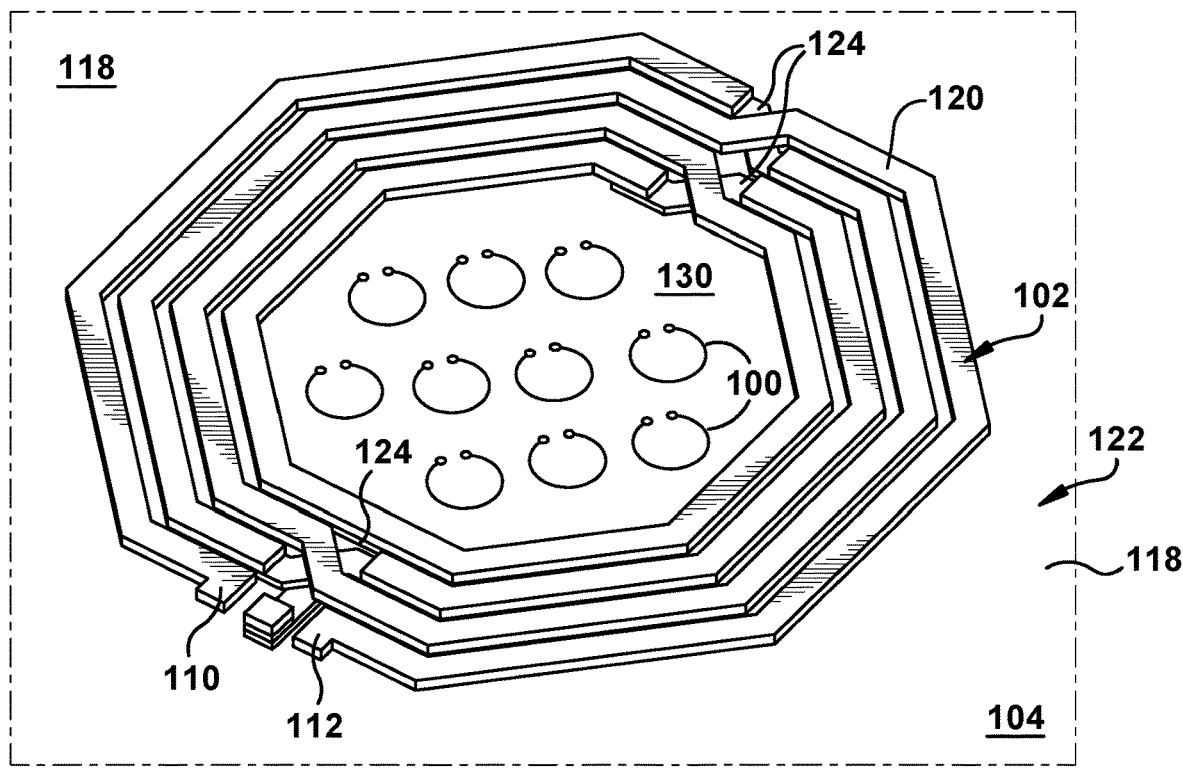
FIG. 4 shows a perspective view of an inductor component for an IC with a dummy fill element, according to embodiments of the disclosure.

FIGS. 2-4 show a plan view and two perspective views, respectively, of various embodiments of a dummy fill element 100 for positioning inside an active inductor component 102 of an integrated circuit (IC) 104, and various forms of active inductor components 102. Active inductor component 102 (hereinafter "inductive component 102") is denoted as "active" because it, although a passive element, provides a desired operational function for IC 104, i.e., reducing parasitic capacitance. Inductor component 102 may include a passive two terminal 110, 112 electrical structure that typically includes a plurality of metal turns 114 that store energy in a magnetic field when an electric current (i) flows through them. That is, inductor component 102 is configured to convert electrical energy into magnetic energy. During steady-state operation of a circuit, inductor component 102 may act substantially as non-resistive wires. During transient operation, however, inductor component 102 will oppose any changes in current therein and impede transitions in current flow between its two terminals, thus reducing parasitic capacitance. A quality factor (Q-factor) of inductor component 102 is a ratio of inductive reactance to resistance at a given frequency, and indicates an inductor's efficiency.

Inductor component 102, also called a coil, reactor or choke, may include any now known or later developed inductor device. In one embodiment, inductor component 102 may take the form of a telecoil or other inductive circuit configuration for counteracting behavior of parasitic electrical elements which may impede signal processing in a device. For example, as shown in FIG. 3, inductor component 102 may take the form of a spiral inductor 120 positioned entirely within one metal layer 122 of IC 104. Spiral inductor 120 may include any number of metal turns 114. In the example shown in FIG. 2, inductor component 102 includes three generally concentric metal turns 114. In the example shown in FIGS. 3 and 4, inductor component 102 includes four generally concentric metal turns 114. In this example, parts of inductor component 102 may extend into metal layers below metal layer 122 in which metal turns 114 are provided, e.g., conductive connectors 124 between turns. Conductive connectors 124 may extend into, for example, dielectric layer(s) with metal lines or vias therein, below metal layer 122.

Suitable dielectric materials may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Metal turns 114 can have any desired lateral cross-sectional shape, e.g., square (FIG. 2), hexagonal (FIGS. 3-4) or any other polygonal shape. In operation, inductor component 102 generates a magnetic field by flowing a current through the conductive loops arranged horizontally around itself. Inductive components 102 may be formed using any now known or later developed semiconductor fabrication process, e.g., photolithography or sidewall image transfer including patterning a mask, etching into a dielectric, deposition of a conductor (e.g., liner and metal), planarization, etc. (single or dual damascene processing). Inductor component 102 may be located in any middle-of-line (MOL) (immediately after first metallization) or back-end-of-line (BEOL) (after MOL) layer(s).

Any number of inductor components 102 may be used in an IC 104. In the context of an inductor, the term "component" refers not only to physical articles which perform specific electrical functions during operation, but also may refer to combinations of such physical articles configured to perform the equivalent electrical function. In the case of an inductor, for an example, two inductors electrically coupled to each other in series will be functionally equivalent to a single inductor. The equivalent inductance (measured, e.g., in Henrys (H)) will be the sum of each inductance of the serially-connected inductors. It is therefore understood that inductor component 102 may represent multiple inductors coupled to each other in a series arrangement, parallel arrangement, or combination of series and parallel arrangements between two terminals to provide a desired amount of inductance.

Figure 5:
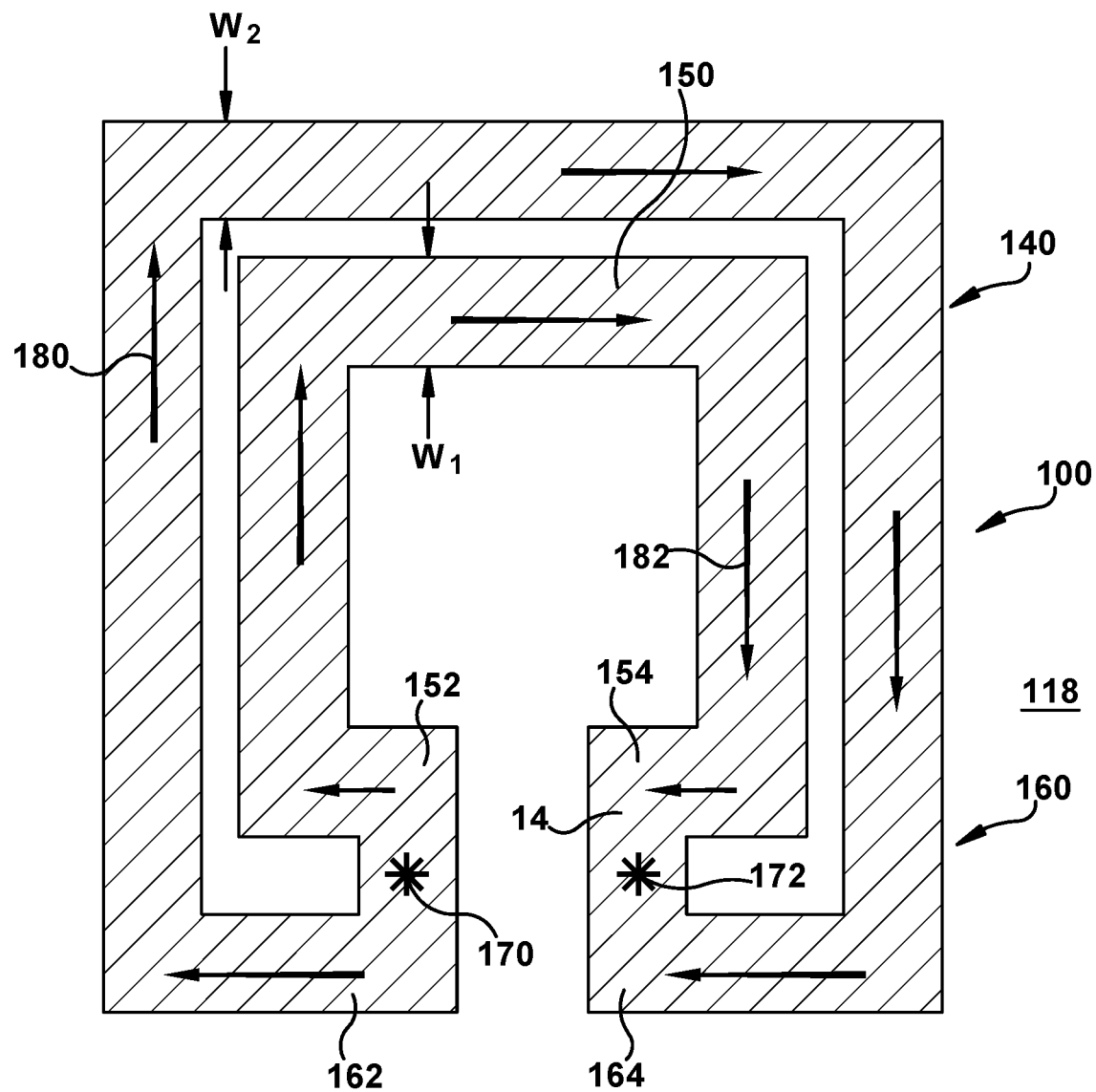
FIG. 5 shows a plan view of a dummy fill element including an eddy current self-canceling element, according to embodiments of the disclosure.
Figure 6:
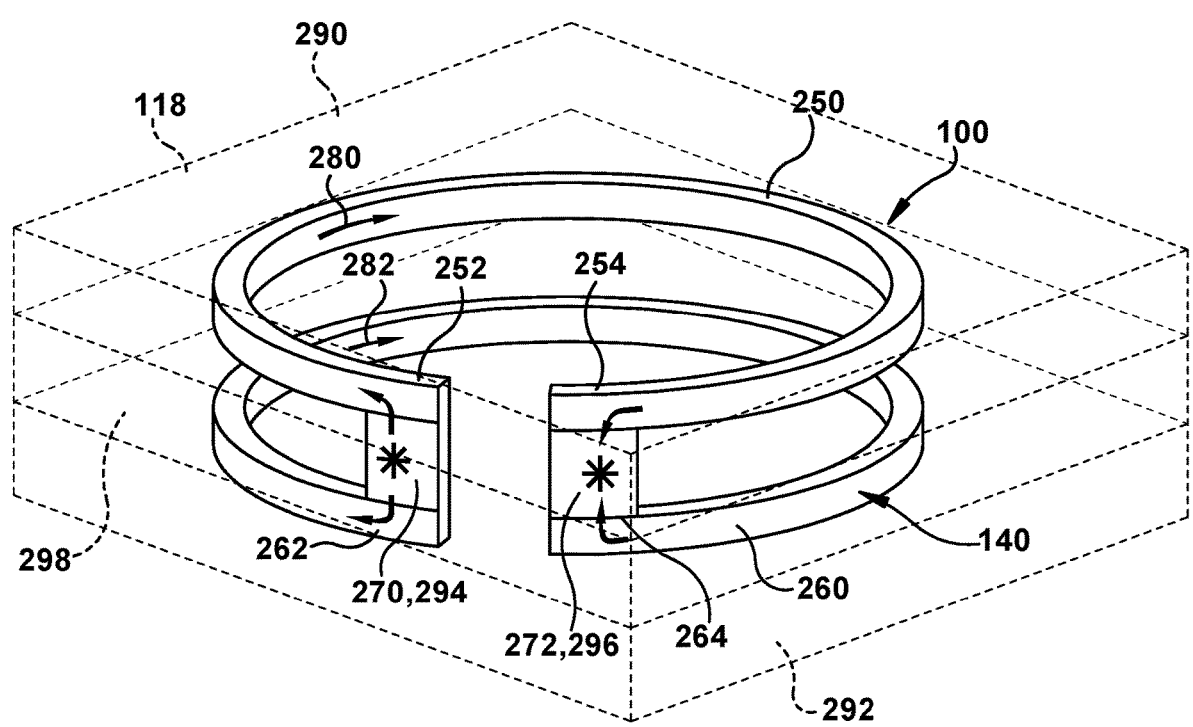
FIG. 6 shows a perspective view of a dummy fill element including an eddy current self-canceling element, according to other embodiments of the disclosure.

Regardless of location in IC 104, inductor component 102 typically includes a relatively large open surface area in an open center 130 of its metal turns 114. Open center 130 of metal turns 114 can present challenges during planarization of metal layer 122 of IC 104 that includes a layer of the inductor component, e.g., in back-end-of-line processing, thus necessitating dummy fill elements 100. As understood in the art, any number of dummy fill elements 100 may be positioned in metal layer 122 in which metal turns 114 of inductor component 102 are provided. Dummy fill elements 100 do not provide any active functioning for IC 104, but are present to achieve a desired metal density for metal layer 122 to prevent damage from planarization. FIG. 5 shows a plan view of a dummy fill element 100 according to one embodiment, and FIG. 6 shows a perspective view of a dummy fill element 100 according to another embodiment.

In contrast to conventional dummy fill elements, each dummy fill element 100 according to embodiments of the disclosure includes an eddy current self-canceling element 140 (FIG. 5). Referring first to the FIG. 5 embodiment, eddy current self-canceling element 140 includes a first conductive incomplete loop 150 having a first end 152 and a second end 154. Eddy current self-canceling element 140 also includes a second conductive incomplete loop 160 having a first end 162 and a second end 164. Conductive incomplete loops 150, 160 may include conductive lines formed in dielectric layer 118 using conventional semiconductor fabrication. Conductive incomplete loops 150, 160 are conductive lines within dielectric layer 118 that take a path that approaches being closed, e.g., like a square or circle, but fall short of being closed. That is, they are only partial loops. The extent to which each loop is incomplete may be user defined, e.g., 350° of a circle, missing 10% of a given side, etc. Conductive incomplete loops 150, 160 can have any lateral cross-sectional shape desired within dielectric layer 118, e.g., open polygon such as square, rectangular, hexagon, octagon; C-shaped; etc. First ends 152, 162 of first conductive incomplete loop 150 and second conductive incomplete loop 160 are electrically connected, e.g., by a portion of conductive line 170. Similarly, second ends 154, 164 of first conductive incomplete loop 150 and second conductive incomplete loop 160 are electrically connected, e.g., by a portion of conductive line 172. Conductive incomplete loops 150, 160 and conductive lines 170, 172 connecting them can be formed together.

As shown in FIG. 5, eddy currents (arrows 180, 182) in each conductive incomplete loop 150, 160 may be created by the magnetic energy generated by inductor component 102. Eddy currents 180, 182 travel clockwise about respective conductive incomplete loops 150, 160. In contrast to conventional dummy fill elements, dummy element's conductive incomplete loops 150, 160 direct eddy currents 180, 182 to cancel at least a portion of each other, i.e., they self-cancel. More specifically, as eddy current 180 travels in loop 160 it reaches second end 164 thereof where it encounters eddy current 182 traveling in loop 150 as it reaches second end 154 thereof, i.e., in conductive line 172. The result of eddy current 180 and eddy current 182 meeting in this manner is that they cancel each other out, or at least a portion of each other out, i.e., they self-cancel. In any event, eddy currents 180, 182 are reduced, which acts to maintain a Q-factor of inductor component 102, compared to a decreased Q-factor using conventional dummy fill elements. Typically, dummy fill elements 100 would all be identical for ease of manufacture with a single shape; however, they may have different sizes. In any event, the collective surface area of dummy fill elements 100 may be selected to achieve any desired surface area density for planarization without worrying about eddy currents.

In the FIG. 5 embodiment, first conductive incomplete loop 150 and second conductive incomplete loop 160 are positioned in a single dielectric layer 118, and positioned within an (innermost) turn 114 of inductor component 102 (FIG. 3). Here, a selected one of conductive incomplete loops 150, 160 (150 as illustrated) is positioned laterally within the other conductive incomplete loop (160 as illustrated). As a result, the inner conductive incomplete loop 150 is shorter in length than the outer conductive incomplete loop 160. The different lengths would normally allow creation of eddy currents 180 182 that are not equal and possibly prevent the desired self-cancellation thereof. In accordance with embodiments of the disclosure, conductive incomplete loops 150, 160 are physically structured to allow eddy current 180, 182 flowing in each conductive incomplete loop 150, 160 to be substantially identical, e.g., in terms of current density, resistance and/or voltage match, between the conductive incomplete loops so as to create equal eddy currents 180, 182 in each. To address this situation, the inner conductive incomplete loop 150, which is shorter, has a larger width W1 than the outer conductive incomplete loop 160. While widths W1, W2 are shown at a particular location, it is understood that the widths are maintained as best possible along the entire lengths of the respective conductive incomplete loops 150, 160. In this manner, inner conductive incomplete loop 150 has a larger perpendicular cross-sectional (into page) than outer conductive incomplete loop 160, allowing eddy current 182 to better match eddy current 180. Any optical proximity correction (OPC) to address mis-sizing or shaping, e.g., due to reactive ion etch (RIE) bias and/or lag, can be carried out to ensure conductive incomplete loops 150, 160 meet desired dimensions.

FIG. 6 shows a perspective view of another embodiment of a dummy fill element 100. Here, dummy fill element 100 includes an eddy current self-canceling element 140 in which a first conductive incomplete loop 250 is positioned in a first dielectric layer 290, and a second conductive incomplete loop 260 is positioned in a different, second dielectric layer 292 than first dielectric layer 290. Dummy fill element 100 according to this embodiment is shown in FIGS. 2 and 4 relative to open center 130 of inductor component 102. First conductive incomplete loop 250 includes a first end 252 and a second end 254, and second conductive incomplete loop 260 includes a first end 262 and a second end 264. A first connector 270 electrically connects first ends 252, 262 of first conductive incomplete loop 250 and second conductive incomplete loop 260, and a second connector 272 electrically connects second ends 254, 264 of first conductive incomplete loop 250 and second conductive incomplete loop 260. First and second connectors 270, 272 may each include at least one via 294, 296. As understood in the art, a via includes a vertically arranged conductor (in via layers) that connects conductors in other layers (referred to as metal layers). Each via 294, 296 may extend through any number of dielectric layers 298 that may separate conductive incomplete loops 250, 260. While one via each 294, 296 is shown, more than one may be used at each location.

As shown in FIG. 6, eddy currents (arrows 280, 282) in each conductive incomplete loop 250, 260 may be created by the magnetic energy generated by inductor component 102. Eddy currents 280, 282 travel clockwise about conductive incomplete loops 250, 260. In contrast to conventional dummy fill elements, dummy element's conductive incomplete loops 250, 260 direct eddy currents 280, 282 to cancel at least a portion of each other. That is, as eddy current 280 travels in conductive incomplete loop 250 it reaches second end 254 thereof where it encounters eddy current 282 traveling in conductive incomplete loop 260 as it reaches second end 264 thereof, i.e., in via(s) 296. The result of this arrangement is that eddy current 280 and eddy current 282 cancel each other out, or at least a portion of each other out, i.e., they self-cancel. In any event, eddy currents 280, 282 are reduced, which acts to maintain a Q-factor of inductor component 102, compared to a decreased Q-factor using conventional dummy fill elements. In contrast to the FIG. 5 embodiment, because conductive incomplete loops 250, 260 in the embodiment shown in FIG. 6 have substantially identical lengths, they do not have to be physically changed to address current density, resistance and voltage matching, i.e., they can be formed using the same mask, with same processing to have identical perpendicular cross-sections for a given IC layer level. That is, they have very similar or identical dimensions. As shown in FIGS. 2 and 4, the collective surface area of dummy fill elements 100 may be selected to achieve any desired surface area density for planarization.

While separate embodiments have been described herein, it is emphasized that both embodiments may be used together within an IC 104, i.e., adjacent one another or at different levels. FIG. 3 shows the two embodiments together in a single layer.

Each of conductive incomplete loops 150, 160, 250, 260 may include any now known or later developed IC conductor including, for example, a metal; carbon; doped silicon; or doped polysilicon; or any other conducting material (such as used for spintronics). The conductor used may vary depending which layer of IC 104 has inductor component 102 therein, e.g., it may be cobalt, tungsten or doped polysilicon at an MOL layer, or copper, cobalt, ruthenium or aluminum at a BEOL layer.

Embodiments of the disclosure also include inductor component 102 including eddy current self-canceling element 140, as described herein. Further, embodiments of the disclosure include IC 104 including inductor component 102, as described herein. It is understood that IC 104 may include a large variety of other conventional IC components such as transistors, resistors, capacitors, etc.

Embodiments of the disclosure may also include a method of forming inductor component 102 and dummy fill pattern 100. Embodiments of the disclosure use conventional semiconductor fabrication techniques to form the unique structure. The method may include forming metal turn 114 of inductor component 102 in a first dielectric layer 118 (FIGS. 2-5), 292 (FIG. 6). Additional metal turns 114, as necessary, may also be formed. The forming of each metal turn 114 may include using any now known or later developed semiconductor fabrication process for conductive elements, as described herein. The method also includes forming at least one dummy fill element 100 laterally inside (innermost) metal turn 114 in at least one dielectric layer 118, 292. As described herein and as shown in FIGS. 5 and 6, each dummy fill element 100 includes: first conductive incomplete loop 150, 250 having first end 152, 252, respectively, and second end 154, 254, and second conductive incomplete loop 160, 260 having first end 162, 262 and second end 164, 264, respectively. As described herein, first ends 152, 252 of first conductive incomplete loop 150, 250 and the second conductive incomplete loop 160, 260 are electrically connected and the second ends 154, 254 of the first conductive incomplete loop and the second conductive incomplete loop are electrically connected. Any number of dummy fill elements 100 can be formed, as necessary to achieve the desired surface area density for planarization of the particular layer. As noted, dummy fill elements 100 allow eddy currents 180, 182, 280, 282 created in each conductive incomplete loop by the magnetic energy during operation of the inductor component to cancel at least a portion of each other.

Referring to FIG. 6, forming dummy fill element 100 according to this embodiment may include forming conductive incomplete loop 260 in a first dielectric layer 292, i.e., prior to other layers being formed. Next, a first via 294 extending upwardly from first end 262 of first conductive incomplete loop 260, and a second via 296 extending upwardly from second end 264 of first conductive incomplete loop 260, may be formed. Second conductive incomplete loop 250 may be formed in a different, second dielectric layer 290 than first dielectric layer 292. Conductive incomplete loop 250 may include first end 252 thereof electrically coupled to first via 294, i.e., to connect it to first end 262 of conductive incomplete loop 260, and may include second end 254 thereof electrically coupled to second via 296, i.e., to connect it to first end 262 of conductive incomplete loop 260. As is understood in the art, vias 294, 296 and conductive incomplete loop 250 may be formed in a number of ways. In one approach, first and second vias 294, 296 may be formed by depositing dielectric layer 298 using a single damascene processing, e.g., create a via opening, deposit a liner and conductor, and planarize. Subsequently, conductive incomplete loop 250 may be formed by depositing another dielectric layer 298 using a single damascene processing, e.g., create a loop opening, deposit a liner and conductor, and planarize. In another approach, a single dielectric layer (labeled as separate 290, 298) may be deposited and first and second vias 294, 296 and conductive incomplete loop 250 may be formed using a dual damascene processing, e.g., create a combined via and loop opening, deposit a liner and conductor, and planarize.

Referring to FIG. 5, forming dummy fill element 100 according to this embodiment may include forming conductive incomplete loop 150 and second conductive incomplete loop 160 both in the same, first dielectric layer 118, e.g., using a single damascene process. As noted herein, a selected one of conductive incomplete loop 150, 160 (150 as shown) is positioned within the other conductive incomplete loop (160 as shown). The inner loop 150 has a larger width, i.e., W1>W2, than outer conductive incomplete loop 160.

Embodiments of the disclosure provide a dummy fill element for positioning inside an active inductor component of an integrated circuit (IC) that self-cancels eddy currents, thus maintaining a Q-factor of the inductor component. At the same time, the dummy fill element allows for creation of the desired surface area density, e.g., of metal, for planarization purposes. Formation of the dummy fill element is inexpensive because it uses conventional fabrication techniques to create the unique structure.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A conductive fill element, comprising:
a first conductive incomplete loop having a first end and a second end, and
a second conductive incomplete loop having a first end and a second end,
wherein the first end of the first conductive incomplete loop and the first end of the second conductive incomplete loop are electrically connected, and the second end of the first conductive incomplete loop and the second end of the second conductive incomplete loop are electrically connected,
wherein the first conductive incomplete loop is positioned laterally within the second conductive incomplete loop, the first conductive incomplete loop having a larger perpendicular cross-sectional area than the second conductive incomplete loop,
wherein the first conductive incomplete loop and the second conductive incomplete loop are in a single dielectric layer.

2. The conductive fill element of claim 1, wherein the first conductive incomplete loop and the second conductive incomplete loop are positioned within a turn of an active inductor component, the active inductor component configured to convert electrical energy into magnetic energy.

3. The conductive fill element of claim 1, wherein the first conductive incomplete loop has a larger width than the second conductive incomplete loop.

4. The conductive fill element of claim 1, wherein each of the first conductive incomplete loop and the second conductive incomplete loop includes one of: metal, carbon, doped silicon, or doped polysilicon.

5. The conductive fill element of claim 1, wherein the first conductive incomplete loop includes a width (W1) and a length (L1), and the second conductive incomplete loop includes a width (W2) and a length (L2).

6. The conductive fill element of claim 5, wherein the width (W1) of the first conductive incomplete loop is larger than the width (W2) of the second conductive incomplete loop, and wherein the length (L1) of the first conductive incomplete loop is less than the length (L2) of the second conductive incomplete loop.

7. The conductive fill element of claim 1, wherein the first end of the first conductive incomplete loop and the first end of the second conductive incomplete loop are electrically connected through a portion of a first conductive line in the single dielectric layer.

8. The conductive fill element of claim 1, wherein the second end of the first conductive incomplete loop and the second end of the second conductive incomplete loop are electrically connected through a portion of a second conductive line in the single dielectric layer.

9. A conductive fill element comprising:
a first conductive incomplete loop having a first end and a second end positioned in a first dielectric layer;
a second conductive incomplete loop having a first end and a second end positioned in a second dielectric layer, the second conductive incomplete loop having substantially similar dimensions to the first conductive incomplete loop;
a first connector that electrically connects the first end of the first conductive incomplete loop and the first end of the second conductive incomplete loop, the first connector including at least a first via; and
a second connector that electrically connects the second end of the first conductive incomplete loop and the second end of the second conductive incomplete loop, the second connector including at least a second via,
wherein each of the first and second via extend through at least a third dielectric layer positioned between the first dielectric layer and the second dielectric layer.

10. The conductive fill element of claim 9, wherein each of the first conductive incomplete loop and the second conductive incomplete loop includes one of: metal, carbon, doped silicon, or doped polysilicon.

11. The conductive fill element of claim 9, wherein the first conductive incomplete loop and the second conductive incomplete loop are positioned within a single turn of an inductor.

12. The conductive fill element of claim 9, wherein the first connector and the second connector are laterally separated by a distance substantially equal to a distance between the first end of the first conductive incomplete loop and the second end of the first conductive incomplete loop.

13. The conductive fill element of claim 9, wherein the first conductive incomplete loop includes an incomplete portion between the first end of the first conductive incomplete loop and the second end of the first conductive incomplete loop.

14. A conductive fill element, comprising:
a first conductive incomplete loop having a first end and a second end; and
a second conductive incomplete loop having a first end and a second end,
wherein the first conductive incomplete loop is positioned laterally within the second conductive incomplete loop in a fixed position in a single dielectric layer within a turn of an active inductor component, the first conductive incomplete loop having a larger perpendicular cross-sectional area than the second conductive incomplete loop,
wherein the first end of the first conductive incomplete loop and the first end of the second conductive incomplete loop are electrically connected through a portion of a first conductive line in the single dielectric layer, and the second end of the first conductive incomplete loop and the second end of the second conductive incomplete loop are electrically connected through a portion of a second conductive line in the single dielectric layer.

15. The conductive fill element of claim 14, wherein the first conductive incomplete loop includes a width (W1) and a length (L1), and the second conductive incomplete loop includes a width (W2) and a length (L2).

16. The conductive fill element of claim 15, wherein the width (W1) of the first conductive incomplete loop is larger than the width (W2) of the second conductive incomplete loop.

17. The conductive fill element of claim 15, wherein the length (L1) of the first conductive incomplete loop is less than the length (L2) of the second conductive incomplete loop.

18. The conductive fill element of claim 14, wherein each of the first and second conductive line include at least one via.

19. The conductive fill element of claim 14, wherein each of the first conductive incomplete loop and the second conductive incomplete loop includes one of: metal, carbon, doped silicon, or doped polysilicon.

* * * * *